(12) United States Patent
Saito et al.

(10) Patent No.: US 8,772,869 B2
(45) Date of Patent: Jul. 8, 2014

(54) POWER SEMICONDUCTOR DEVICE

(75) Inventors: Wataru Saito, Kanagawa-ken (JP);
Syotaro Ono, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 1642 days.

(21) Appl. No.: 12/050,405

(22) Filed: Mar. 18, 2008

(65) Prior Publication Data
US 2008/0246085 A1 Oct. 9, 2008

(30) Foreign Application Priority Data

Apr. 3, 2007 (JP) ................................. 2007-097639

(51) Int. Cl.
*H01L 29/66* (2006.01)

(52) U.S. Cl.
USPC ............ 257/342; 257/328; 257/329; 257/335; 257/339; 257/492; 257/493; 257/498; 257/504; 257/544; 257/598; 257/E29.012; 257/E29.019; 438/208; 438/220; 438/356; 438/414; 365/221

(58) Field of Classification Search
USPC .......... 257/328, 329, 335, 339–342, 492, 493, 257/498, 504, 544, 545, 549–550, 598, 927, 257/E29.012, E29.019; 438/208, 220, 356, 438/414, FOR. 234; 365/221
See application file for complete search history.

(56) References Cited

U.S. PATENT DOCUMENTS

| 6,066,878 | A | 5/2000 | Neilson |
| 6,787,848 | B2 | 9/2004 | Ono et al. |
| 6,888,195 | B2 | 5/2005 | Saito et al. |
| 6,903,418 | B2 | 6/2005 | Iwamoto et al. |
| 7,042,046 | B2 | 5/2006 | Onishi et al. |
| 2002/0088990 | A1* | 7/2002 | Iwamoto et al. ............. 257/136 |
| 2007/0177444 | A1* | 8/2007 | Miyajima ..................... 365/221 |
| 2007/0228462 | A1 | 10/2007 | Saito |
| 2007/0272977 | A1 | 11/2007 | Saito et al. |

FOREIGN PATENT DOCUMENTS

| JP | 2001-298191 | 10/2001 |
| JP | 2002-170955 | 6/2002 |
| JP | 2002-368215 | 12/2002 |
| JP | 2004-119611 | 4/2004 |
| JP | 2006-156989 | 6/2006 |

* cited by examiner

*Primary Examiner* — Meiya Li
(74) *Attorney, Agent, or Firm* — Oblon, Spivak, McClelland, Maier & Neustadt, L.L.P.

(57) ABSTRACT

A power semiconductor device includes: a first semiconductor layer; second and third semiconductor layers above and alternatively arranged along a direction parallel to an upper surface of the first semiconductor layer; and plural fourth semiconductor layers provided on some of immediately upper regions of the third semiconductor layer. An array period of the fourth semiconductor layers is larger than that of the second semiconductor layer. A thickness of part of the gate insulating film in an immediate upper region of a central portion between the fourth semiconductor layers is thicker than a thickness of part of the gate insulating film in an immediate upper region of the fourth semiconductor layers. Sheet impurity concentrations of the second and third semiconductor layers in the central portion are higher than a sheet impurity concentration of the third semiconductor layer in an immediately lower region of the fourth semiconductor layers.

20 Claims, 11 Drawing Sheets

Cross-sectional View of Device

Top View of Pillars

POWER SEMICONDUCTOR DEVICE

CROSS-REFERENCE TO RELATED APPLICATIONS

This application is based upon and claims the benefit of priority from the prior Japanese Patent Application No. 2007-097639, filed on Apr. 3, 2007; the entire contents of which are incorporated herein by reference.

BACKGROUND OF THE INVENTION

1. Field of the Invention

This invention relates to a power semiconductor device and particularly to a power semiconductor device having a super-junction structure.

2. Background Art

The ON resistance of a vertical power MOSFET (metal-oxide-semiconductor field effect transistor) greatly depends on the electric resistance of its conduction layer (drift layer). The dopant concentration that determines the electric resistance of the drift layer cannot exceed a maximum limit, which depends on the breakdown voltage of a p-n junction between the base layer and the drift layer. Thus there is a tradeoff between the device breakdown voltage and the ON resistance. Improving this tradeoff is important for low power consumption devices. This tradeoff has a limit determined by the device material. Overcoming this limit is the way to realizing devices with low ON resistance beyond existing power devices.

As an example MOSFET to solve this problem, a structure with p-pillar layers and n-pillar layers buried in the drift layer is known as a super-junction structure (see, for example, JP-A 2001-298191 (Kokai)). In the super-junction (hereinafter, also referred to as SJ structure), a non-doped layer is artificially produced by equalizing the amount of charge (amount of impurities) contained in the p-pillar layer with that contained in the n-pillar layer. Thus, while holding a high breakdown voltage, a current is passed through highly doped n-pillar layer. Hence a low ON resistance beyond the material limit is realized.

Thus the SJ structure can be used to realize a balance between ON resistance and breakdown voltage. However, when more reduction of the ON resistance and more increase of the breakdown voltage of the power semiconductor device using the SJ structure are attempted, the following problems are caused. That is, for more reducing the ON resistance, the impurity amounts of the p-pillar layer and the n-pillar layer can be increased. However, in this case, for fully depleting the p-pillar layer and the n-pillar layer, larger horizontal electric field is required, and therefore, vertical electric field determining the breakdown voltage is lower. As a result, the breakdown voltage becomes low. Moreover, for more increasing the breakdown voltage, the impurity amounts of the p-pillar layer and the n-pillar layer can be reduced to make it easy to deplete the pillar layers. However, in this case, the ON resistance increases. Furthermore, for reducing the ON resistance with holding a high breakdown voltage, an array period of the p-pillar layer and n-pillar layer and additionally the impurity amounts of the p-pillar layer and the n-pillar layer can be increased. However, in this case, process steps get complex, and difficulty of the process turns up.

SUMMARY OF THE INVENTION

According to an aspect of the invention, there is provided a power semiconductor device, including: a first semiconductor layer of a first conductivity type; a second semiconductor layer of the first conductivity type and a third semiconductor layer of a second conductivity type that are provided above the first semiconductor layer and alternatively arranged along a direction parallel to an upper surface of the first semiconductor layer; a plurality of fourth semiconductor layers of the second conductivity type provided on some of immediately upper regions of the third semiconductor layers and connected to the third semiconductor layer; a fifth semiconductor layer of the first conductivity type selectively formed on an upper surface of each of the fourth semiconductor layers; a control electrode provided between immediately upper regions of the contiguous fourth semiconductor layers; a gate insulating film provided among the second semiconductor layer, the third semiconductor layer, the fourth semiconductor layer, the control electrode; a first main electrode provided on the lower surface of the first semiconductor layer and electrically connected to the first semiconductor layer; and a second main electrode provided on the fourth semiconductor layer and the fifth semiconductor layer and connected to the fourth semiconductor layer and the fifth semiconductor layer, an array period of the fourth semiconductor layers being larger than an array period of the second semiconductor layers, a thickness of a part of the gate insulating film disposed in an immediate upper region of a central portion between the fourth semiconductor layers being thicker than a thickness of a part of the gate insulating film disposed in the immediate upper region of the fourth semiconductor layer, and sheet impurity concentrations of the second semiconductor layer and the third semiconductor layer that are located in the central portion being higher than a sheet impurity concentration of the third semiconductor layer disposed in an immediately lower region of the fourth semiconductor layer.

DETAILED DESCRIPTION OF THE INVENTION

Figure 1:
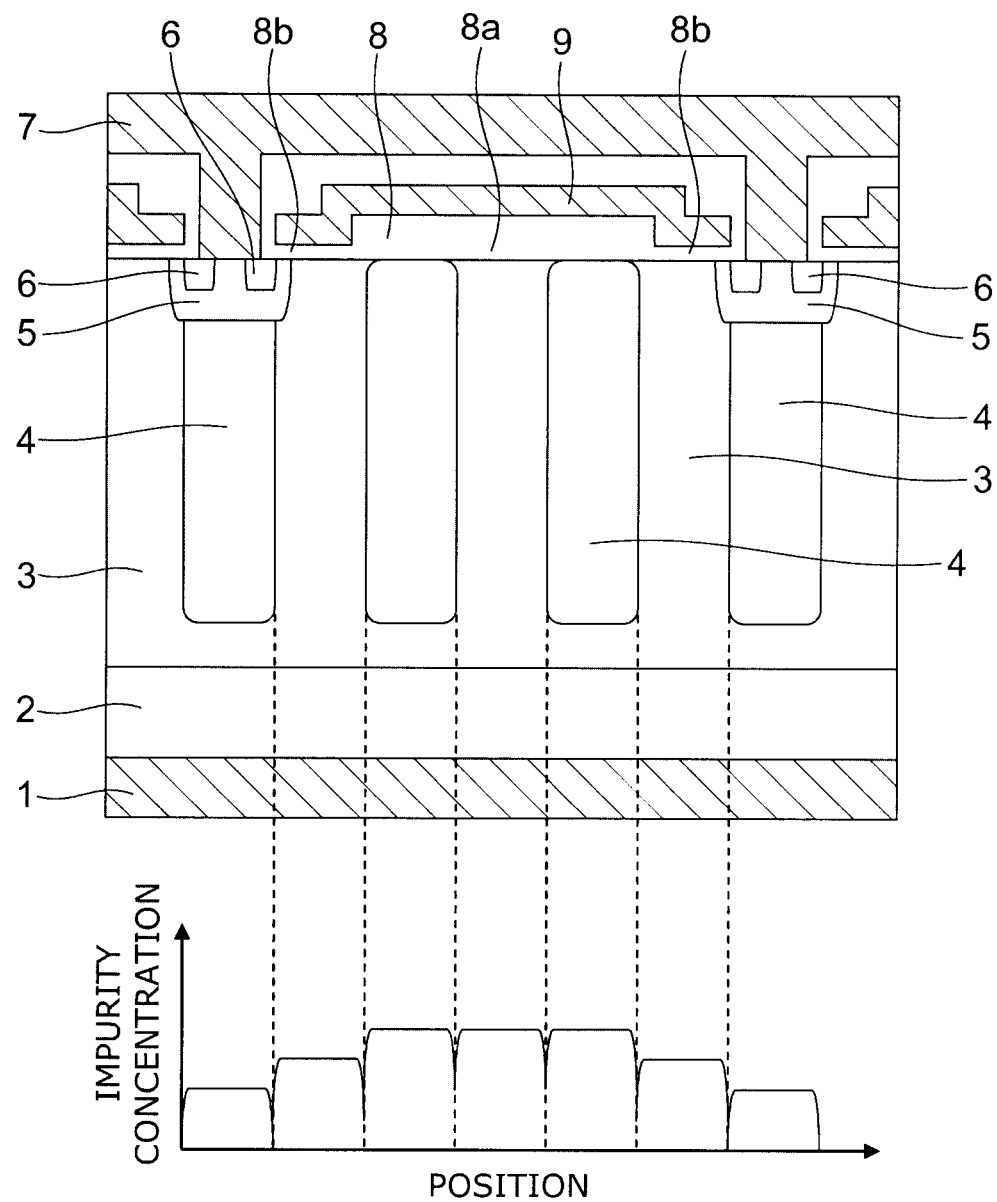
FIG. 1 is a cross-sectional view schematically illustrating a structure of a power MOSFET according to a first embodiment of this invention and a graphic view illustrating a profile of an impurity concentration of a SJ structure, in which the horizontal axis is position of the lateral direction in the SJ structure and the vertical axis is pillar concentration.

Hereinafter, embodiments of this invention will be explained with reference to drawings. In the following embodiments, the first conductivity type is set to be n type and the second conductivity type is set to be p type. Moreover, the same numbers are appended to the same parts in the drawings.

First Embodiment

FIG. 1 is a cross-sectional view schematically illustrating a structure of a power MOSFET that is a power semiconductor device according to a first embodiment of this invention and a graphic view illustrating a profile of an impurity concentration of a SJ structure, in which the horizontal axis is position of the lateral direction in the SJ structure and the vertical axis is impurity concentration in each of the pillar layers (hereinafter, also referred to as pillar concentration).

The horizontal axis of the graphic view shown in FIG. 1 corresponds to position in the lateral direction in the cross-section. This is the same in the other views to be described later.

Figure 2:
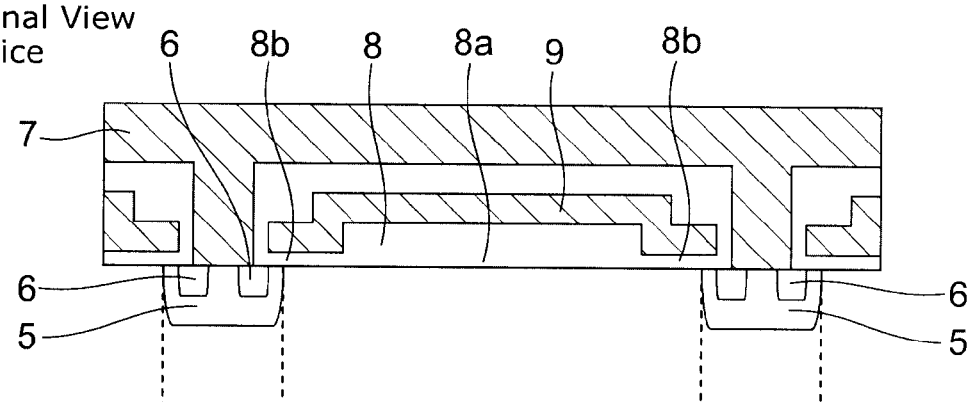
FIG. 2 is a partial cross-sectional view and a top view illustrating the power MOSFET shown in FIG. 1.
Figure 2:
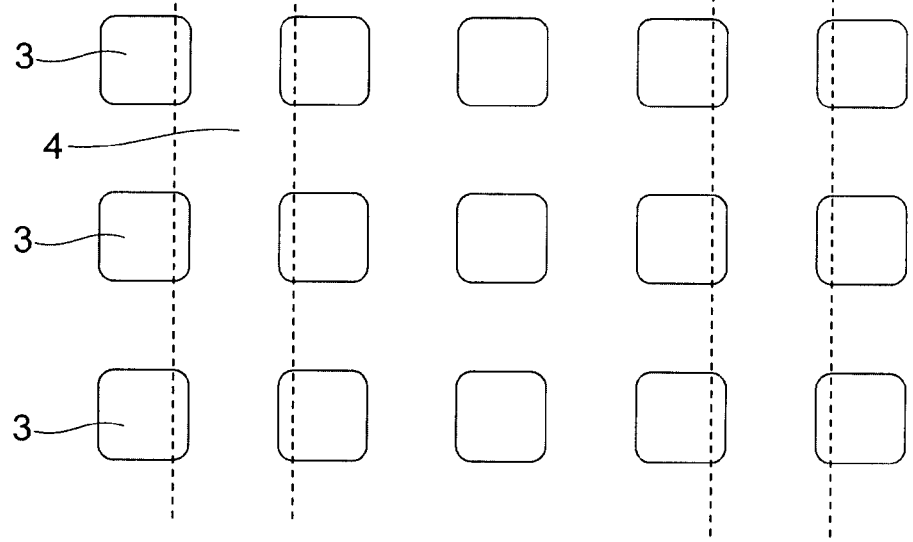

FIG. 2 is a partial cross-sectional view and a top view illustrating the power MOSFET shown in FIG. 1.

In the cross-sectional view of FIG. 2, only the upper portion of the power MOSFET is shown.

As shown in FIG. 1 in the MOSFET according to this embodiment, an n-type $n^+$ drain layer 2 is provided as a first semiconductor layer, and on the $n^+$ drain layer 2, a n-pillar layer 3 that is a second semiconductor layer and a p-pillar layer 4 that is a third semiconductor layer, which forms the super-junction structure (SJ structure). Conductivity types of the n-pillar layer 3 and p-pillar layer 4 are n type and p type respectively, and the layers are arranged alternatively and periodically along the direction parallel to the upper surface of the $n^+$ drain layer 2 (hereinafter, referred to as lateral direction).

In one example, as shown in FIG. 2, viewed from the direction vertical to the upper surface of the $n^+$ drain layer 2 (hereinafter, referred to as longitudinal direction), the shape of each of n-pillar layers 3 is an approximate square and a plurality of the n-pillar layers 3 are arranged in a matrix form. Moreover, the p-pillar layer 4 is formed in a lattice shape and buried in a gap between the n-pillar layers 3. The p-pillar layer 4 may be in contact with the $n^+$ drain layer 2 and no contact is also possible. However, in FIG. 1, there is shown an example in which the p-pillar layer 4 is not in contact with the $n^+$ drain layer 2 and an n-type layer formed integrally with the n-pillar layers 3 lies between the layers. Through this n-type layer, the n-pillar layers 3 are connected to each other.

Moreover, above the n-pillar layer 3 and p-pillar layer 4, a p-type p-base layer 5 is provided and is in contact with the n-pillar layer 3 and the p-pillar layer 4. Viewed from the longitudinal direction, a shape of the p-base layer 5 is a stripe form, and a plurality of p-base layers 5 are formed with parallel to each other. In the cross-section of FIG. 1, the p-base layer extends in the perpendicular direction to the page. And, an array period of the p-base layers 5 is larger than an array period of the n-pillar layers 3. Therefore, as shown in FIG. 1, a plurality of the n-pillar layers 3 are arranged between the contiguous p-base layers 5, and each of the p-pillar layers 4 is arranged between the n-pillar layers 3. On each of the p-base layers 5, two n-type n-source layers 6 serving as a fifth semiconductor layer are selectively formed. The two n-source layers 6 are separate in the lateral direction and extend in the direction perpendicular to the page in the cross-section of FIG. 1.

Furthermore, between immediately upper regions of the contiguous p-base layers 5, a gate electrode 9 is provided as a control electrode. That is, the gate electrode 9 passes from an immediately upper region of a part of one p-base layer 5 out of the contiguous p-base layers 5 that lies between the n-source layer 6 and the n-pillar layer 3 in the side of the other p-base layer 5, through an immediately upper region of the n-pillar layers 3 and the p-type pillars layer 4 arranged between the contiguous p-base layers 5. And, the gate electrode 9 extends in an immediately upper region of a part of the other p-base layer 5 that lies between the n-source layer 6 and the n-pillar layer 3 in the side of the one p-base layer 5.

Furthermore, upper surfaces of the n-pillar layers 3, the p-pillar layers 4, and the p-base layers 5 compose the same plane, and a gate insulating film 8 is provided on the plane. That is, the gate insulating film 8 lies among the n-pillar layers 3, the p-pillar layers 4, the p-base layers 5, and the gate electrode 9, and insulates the gate electrode 9 from the n-pillar layers 3, the p-pillar layers 4, the p-base layers 5, and the n-source layers 6.

Furthermore, on the lower surface of the $n^+$ drain layer 2, a drain electrode 1 serving as a first main electrode is provided and electrically connected to the lower surface of $n^+$ drain layer 2. On the other hand, above the n-pillar layers 3, the p-pillar layers 4, the p-base layers 5, and the n-source layers 6, a source electrode 7 is provided and connected to the p-base layers 5 and the n-source layer 6. The source electrode 7 is also provided on the gate electrode 9 but insulated by an insulating film from the gate electrode 9.

In one example, the $n^+$ drain layer 2, the n-pillar layers 3, the p-pillar layers 4, the p-base layers 5, and the n-source layers 6 are formed by single crystal silicon (Si). Moreover, the gate insulating film 8 is formed by silicon oxide ($SiO_2$).

Furthermore, the gate electrode 9 is formed by polycrystalline silicon. Moreover, the drain electrode 1 and the source electrode 7 are formed by metal.

In this embodiment, a thickness of the gate insulating film 8 varies in the lateral direction. That is, the gate insulating film 8 is thin near the p-base layers 5 and thick in the position separate from the p-base layers 5. Moreover, specifically, a thickness of a part of the gate insulating film 8 arranged in the immediately upper region of the central portion that lies between the p-base layers 5, namely, the central portion 8a arranged in an immediately lower region of the central portion of the gate electrode 9 is thicker than a thickness of a part arranged in an immediately upper region of the p-base layer 5, namely, the peripheral portion 8b arranged in an immediately lower region of the periphery of the gate electrode 9. The thickness of the peripheral portion 8b serves as a factor determining threshold voltage and therefore required to be thin to some extent, for example, approximately 0.1 µm. On the other hand, the thickness of the central portion 8a does not affect the gate threshold voltage and therefore can be thick, for example, 1.0-1.5 µm.

Moreover, impurity concentration of the n-pillar layers 3 and the p-pillar layers 4 (pillar concentration) are nonuniform in the lateral direction. That is, the pillar concentration is lower in a region nearer to the p-base layers 5 and higher in a region being more separate from the p-base layers 5. For example, the impurity concentration of the n-pillar layers 3 and the p-pillar layers 4 that are located in the central portion of the region between the p-base layers 5, namely, in an immediately lower region of the central portion 8a is higher than the impurity concentration of the p-pillar layers 4 arranged in the immediately lower regions of the p-base layers 5, in the immediately lower regions of the peripheral portions 8b of the gate insulating film 8.

The impurity concentration is shown and explained in the graphic view of the FIG. 1. However, the parameter used in the design for the SJ structure is a sheet impurity concentration, namely, a product of impurity concentration ($cm^{-3}$) and width of pillar layers (cm). In this embodiment, the width of n-pillar layers 3 and the width of the p-pillar layers 4 are set to be constant, and therefore, change of the impurity concentration shown in FIG. 1 is synonymous with change of the sheet impurity concentration. Accordingly, when the impurity concentration is set to be constant and the width of the pillar layers is changed with the same profile with the profile shown in the graphic view of FIG. 1, the same effect as this embodiment can be obtained. That is, the vertical axis of the graphic view of FIG. 1 may be width of the pillar layers. This is the same in the other embodiments to be described layer.

Next, the working effects of the power MOSFET according to this embodiment will be explained.

When a high voltage is applied between the drain electrode 1 and the source electrode 7, high voltage is added between the source electrode 7 and drain electrode 1 and between the gate electrode 9 and the drain electrode 1. This voltage is maintained by the SJ structure and the gate insulating film 8.

In the immediately lower region of the gate electrode 9, the gate insulating film 8 and the SJ structure lie between the gate electrode 9 and the drain electrode, and therefore, breakdown voltage is divided between the gate insulating film 8 and the SJ structure. In this case, in the immediately lower region of the central portion of the gate electrode 9, the gate insulating film 8 is set to be thick to enlarge voltage held by the gate insulating film 8, and thereby, the voltage held by the SJ structure can be small. Thereby, the pillar concentration of the SJ structure can be enhanced.

On the other hand, in the immediately lower region of the periphery of the gate electrode 9, the thickness of the gate insulating film 8 affects the gate threshold voltage, and therefore, cannot be set to be too thick. Accordingly, perpendicular the breakdown voltage held by the gate insulating film 8 is small, and therefore the breakdown voltage held by the SJ structure is required to be large. Therefore, the pillar concentration cannot be set to be too high. Moreover, between the source electrode 7 and the drain electrode 1, the gate insulating film 8 does not lie and only the SJ structure lies, and therefore, the entirety of the breakdown voltage has to be held by the SJ structure. Therefore, it is necessary to suppress the pillar concentration to be low.

As described above, when the thickness of the gate insulating film 8 is varied according to the position in the lateral direction, the breakdown voltage to be held by the SJ structure is also different according to position of the lateral direction. In this embodiment, the pillar concentration is varied according to the position in the lateral direction, and the pillar concentration is set to be high in the position in which the pillar concentration can be high. Thereby, although the pillar concentration in the entirety of the device cannot be uniformly enhanced, the pillar concentration is enhanced locally in the immediately lower region of the central portion of the gate electrode 9 and thereby the ON resistance of the entirety of the device can be reduced.

As described above, according to this embodiment, by forming a partially thick sheet impurity concentration, the hold voltage assigned to the SJ structure, and it becomes possible to enhance the pillar concentration with holding the breakdown voltage of the device, and the power semiconductor device having a low ON resistance can be realized.

As one example, a device having a breakdown voltage of 600 V is assumed. When the thickness of the central portion 8a of the gate insulating film 8 is set to be 1.5 µm, the hold voltage of this portion becomes approximately 300 V. In this case, the hold voltage of the SJ structure can be set to approximately 300 V. On the other hand, the hold voltage assigned to the SJ structure immediately under the central portion 8a becomes generally half of the hold voltage assigned to the SJ structure immediately under the p-base layer 5, and therefore, immediately under the p-base layer 5, the pillar concentration can be increased to be approximately twice as much. And, when portions having twice the pillar concentration occupy the half volume of the entirety, the ON resistance of the entirety of the device is reduced at approximately 25%.

Moreover, as shown in FIG. 2, in this embodiment, the p-pillar layers 4 are integrally formed in a lattice shape. And, some of the p-pillar layers 4 are connected to the p-base layers 5. Thereby, the entirety of the p-pillar layers 4 is connected to the p-base layers 5. As a result, when high voltage is applied between the source electrode 7 and the drain electrode 1, holes are released from the p-pillar layers 4 through the p-base layers 5, and the p-pillar layers 4 can be fully depleted rapidly. On the other hand, when high voltage comes to be not applied, holes are supplied to the p-pillar layers 4 through the p-base layers 5, and the depletion layer rapidly disappears. As described above, by forming the p-pillar layers 4 in a lattice shape, electric charge and discharge of holes with respect to the p-pillar layers 4 can be easily performed, and response of the power MOSFET can be enhanced.

Furthermore, in this embodiment, it is easy to form a thick gate insulating film. Moreover, when the SJ structure is produced by repeating ion implantation and burying growth, it can be easily realized that mask width in the ion implantation is changed to partially vary the pillar concentration. Therefore, in this embodiment, the power MOSFET whose ON resistance is drastically reduced with compared to a conventional power MOSFET can be produced only by modifying the pattern of the mask without modifying conventional processes.

Modified Example of First Embodiment

Figure 3:
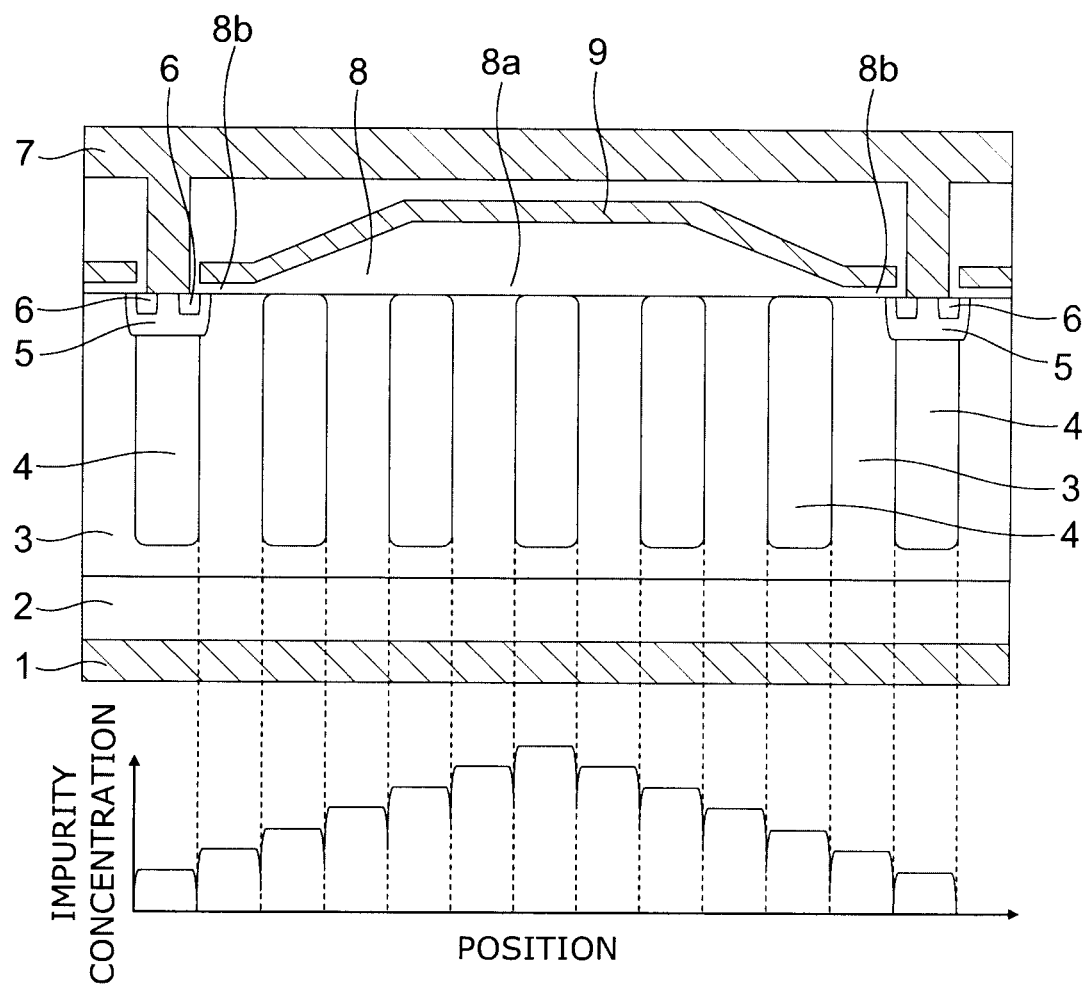
FIG. 3 is a cross-sectional view schematically illustrating a power MOSFET according to a modified example of the first embodiment and a graphic view illustrating a profile of an impurity concentration of a SJ structure, in which the horizontal axis is position of the lateral direction in the SJ structure and the vertical axis is pillar concentration.

FIG. 3 is a cross-sectional view schematically illustrating a power MOSFET according to a modified example of the first embodiment and a graphic view illustrating a profile of an impurity concentration of a SJ structure, in which the horizontal axis is position of the lateral direction in the SJ structure and the vertical axis is pillar concentration.

As shown in FIG. 3, in the power MOSFET according to this modified example, an array period of the p-base layers 5 is large, compared to the power MOSFET according to the above-described first embodiment. Moreover, the peripheral portion of the gate electrode 9 is formed diagonally. More specifically, both end portions of the gate electrode 9 in a longitudinal direction extend in the direction inclining to the upper surface of the n$^+$ drain layer 2. Furthermore, the impurity concentration of each of the pillar layers has an intermediate value of the impurity concentrations of the pillar layers arranged at both sides of the pillar layers, and the pillar concentration varies approximately continuously along the lateral direction.

In the SJ structure, also in the case of varying the pillar concentration along the lateral direction, it is preferable to equalize the impurity concentrations of the contiguous pillar layers to balance the charge. This is because the breakdown voltage comes to lower when the balance of the charge is broken. In this modified example, by setting the impurity concentration of a pillar layer to be an intermediate concentration of the impurity concentrations of the pillar layers of both sides thereof, it becomes possible that the pillar concentration is continuously varied to vary the pillar concentration largely with holding the charge balance with respect to the contiguous pillars. Moreover, the thickness of the insulating film is continuously varied so as correspond to the variation of the pillar concentration. Thereby, because the hold voltage of the gate insulating film 8 is proportional to thickness thereof, the total hold voltage of the SJ structure and the gate insulating film 8 becomes uniform in the lateral direction and thereby the breakdown voltage of the entirety of the device is improved.

Second Embodiment

Figure 4:
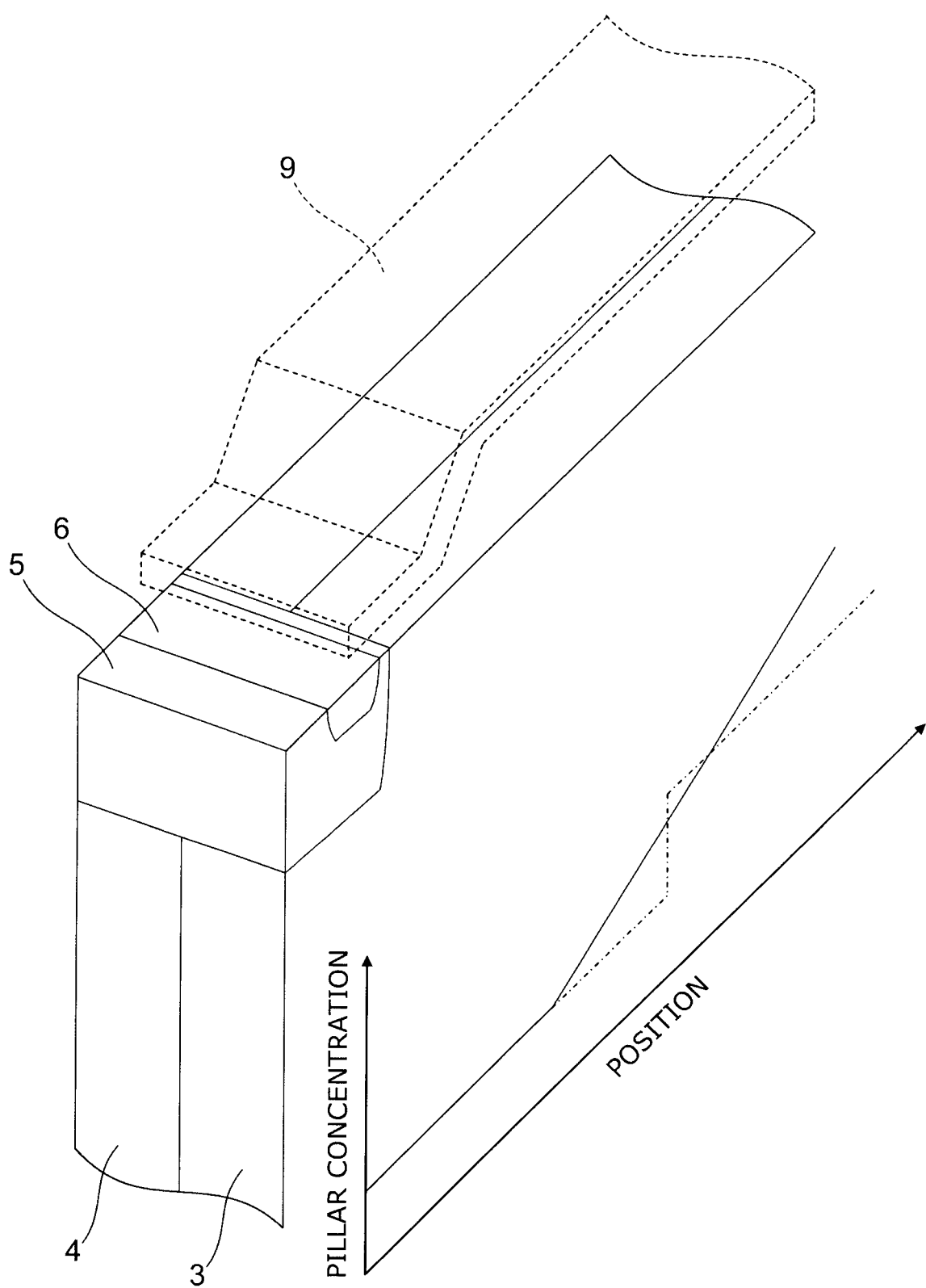
FIG. 4 is a perspective cross-sectional view schematically illustrating a power MOSFET according to a second embodiment of this invention and a graphic view illustrating a profile of an impurity concentration of a SJ structure, in which the horizontal axis is position of the lateral direction in the SJ structure and the vertical axis is pillar concentration.

FIG. 4 is a perspective cross-sectional view schematically illustrating a power MOSFET according to a second embodiment of this invention and a graphic view illustrating a profile of an impurity concentration of a SJ structure, in which the horizontal axis is position of the lateral direction in the SJ structure and the vertical axis is pillar concentration.

As shown in FIG. 4, in the power MOSFET according to this embodiment, the n-pillar layers 3 and the p-pillar layers 4 are formed in a stripe form. Also, the p-base layers 5 are formed in a stripe form and extend along the array direction (lateral direction) of the n-pillar layers 3 and the p-pillar layers 4. That is, the direction to which the p-base layers 5 extend is orthogonal to the direction to which the n-pillar layers 3 and the p-pillar layers 4 extend. Furthermore, the gate electrode 9 is also formed in a stripe form and extends in the direction orthogonal to the direction to which the p-base layers 5 extend, namely, the direction to which the n-pillar layers 3 and the p-pillar layers 4 extend.

The impurity amount contained in each of the pillar layers of the SJ structure is uniform between the pillar layers. However, the impurity concentration inclines in each of the pillar layers. For example, as shown by the solid line in the graphic view of FIG. 4, the impurity concentration in each of the pillar layers is low near the p-base layers 5 and increases continuously toward the central portion between the p-base layers 5 and is the highest in the central portion between the p-base layers 5. Or, as shown in the dashed-dotted line in the graphic view of FIG. 4, the impurity in each of the pillar layers varies in a step form and is low in a region near to the p-base layers 5 and high in a region separate from the p-base layers 5. The structure except for the above-described part in this embodiment is the same as the above-described first embodiment.

Next, the working effects of the power MOSFET according to this embodiment will be explained.

In the above-described power MOSFET according to the first embodiment (see, FIG. 1), the upper end portions of some of n-pillar layers 3 are not in contact with the p-base layer 5. Therefore, when a positive electric field is applied to the gate electrode 9 for setting the power MOSFET to be in an ON state, an inversion channel is formed on the surface of the p-pillar layer 4 as well as on the surface of the p-base layer 5. However, in this case, resistance of the inversion channel of the p-pillar layer 4 becomes contained in the ON resistance.

By contrast, in the power MOSFET according to this embodiment, because the p-base layers 5 extend along the array direction of the n-pillar layers 3, the upper ends of all of the n-pillar layers 3 is directly in contact with the p-base layer 5. Therefore, when the power MOSFET is set to be in a ON state, the reverse cannel is not formed on the surface of the pillar layer, and the resistance of the inversion channel of the p-pillar layer 4 is not added to the ON resistance.

In this embodiment, the spreading resistance, namely, resistance when electrons flow from the interface between the n-pillar layer 3 and the p-base layer 5 to the inside of the n-pillar layer 3 is added to the ON resistance. However, because an accumulation channel is formed in the interface between the n-pillar layer 3 and the gate insulating film 8, the spreading resistance is sufficiently small, compared to the resistance of the inversion channel of the p-pillar layer 4. Accordingly, according to this embodiment, compared to the above-described first embodiment, the ON resistance can be more reduced. The working effects except for the above-described effect in this embodiment are the same as the above-described first embodiment. For obtaining the above-described effect, the direction to which the p-base layers 5 extend is not necessarily orthogonal to the direction to which the n-pillar layers 3 extend but is sufficient if intersecting with the direction to which the n-pillar layers 3 extend.

Third Embodiment

Figure 5:
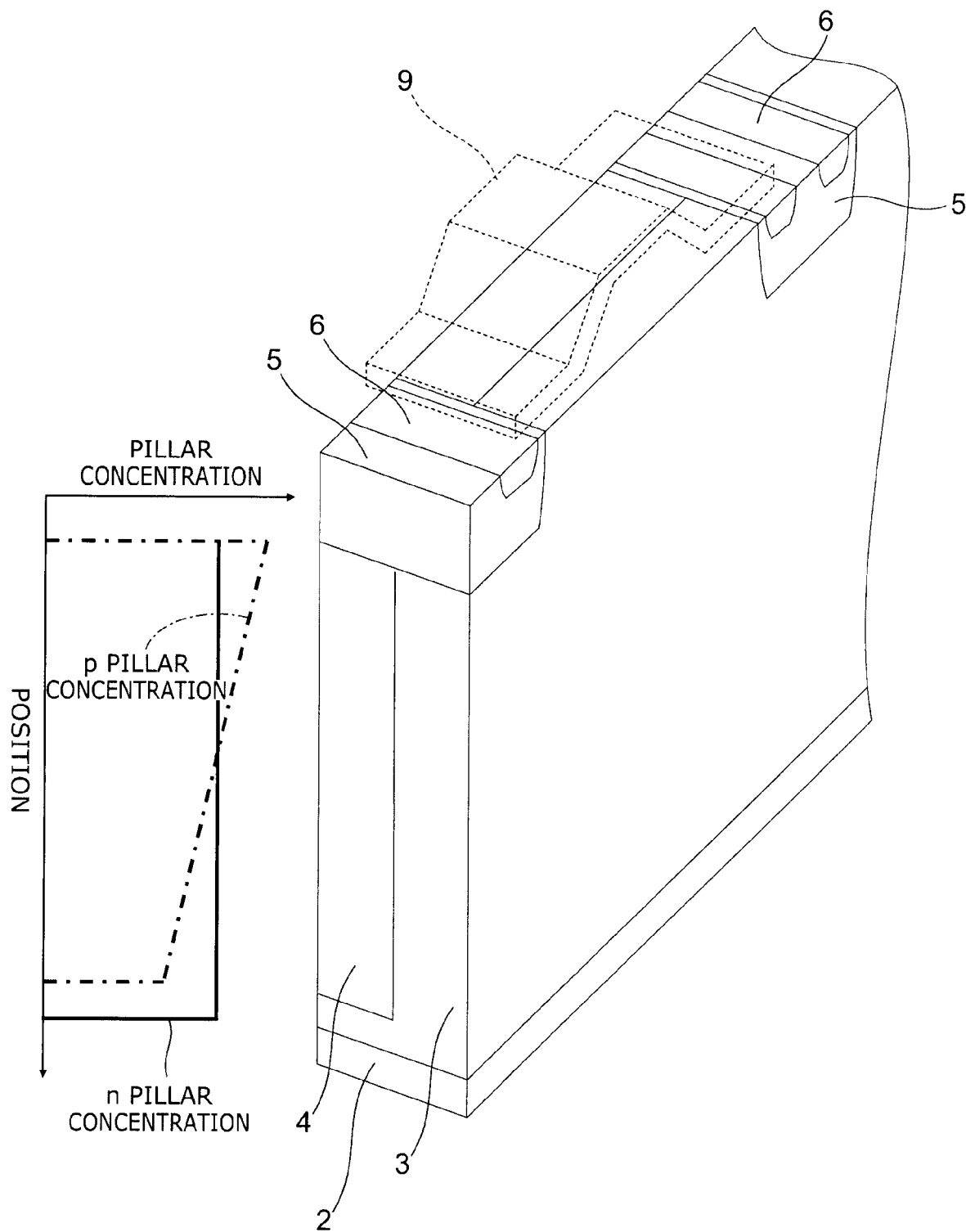
FIG. 5 is a perspective cross-sectional view schematically illustrating a power MOSFET according to a third embodiment of this invention and a graphic view illustrating a profile of an impurity concentration of a SJ structure, in which the vertical axis is position in the longitudinal direction in the SJ structure and the horizontal axis is pillar concentration.

FIG. 5 is a perspective cross-sectional view schematically illustrating a power MOSFET according to a third embodiment of this invention and a graphic view illustrating a profile of an impurity concentration of a SJ structure, in which the vertical axis is position in the longitudinal direction in the SJ structure and the horizontal axis is pillar concentration.

As shown in FIG. 5, in the power MOSFET according to this embodiment, compared to the power MOSFET according to the above-described second embodiment (see FIG. 4), the point that the pillar concentration of the p-pillar layer 4 inclines in the longitudinal direction is different. That is, the impurity concentration in the n-pillar layer 3 is constant in the longitudinal direction but the impurity concentration in the p-pillar layer 4 decreases continuously from the source electrode 7 to the drain electrode 1. Thereby, in a part of the side of the source electrode 7 in the SJ structure, the impurity concentration in the p-pillar layer 4 is higher than the impurity concentration of the n-pillar layer 3. In a part of side of the drain electrode 1 therein, the impurity concentration in the p-pillar layer 4 is lower than the impurity concentration of the n-pillar layer 3. As a result, the electric fields of the upper and lower ends of the SJ structure can be small, and the negative resistance becomes difficult to be caused even when large avalanche current flows, and therefore, large avalanche tolerance can be obtained. The structure and the working effects except for the above-described ones in this embodiment are the same as the above-described second embodiment.

Modified Example of Third Embodiment

Figure 6:
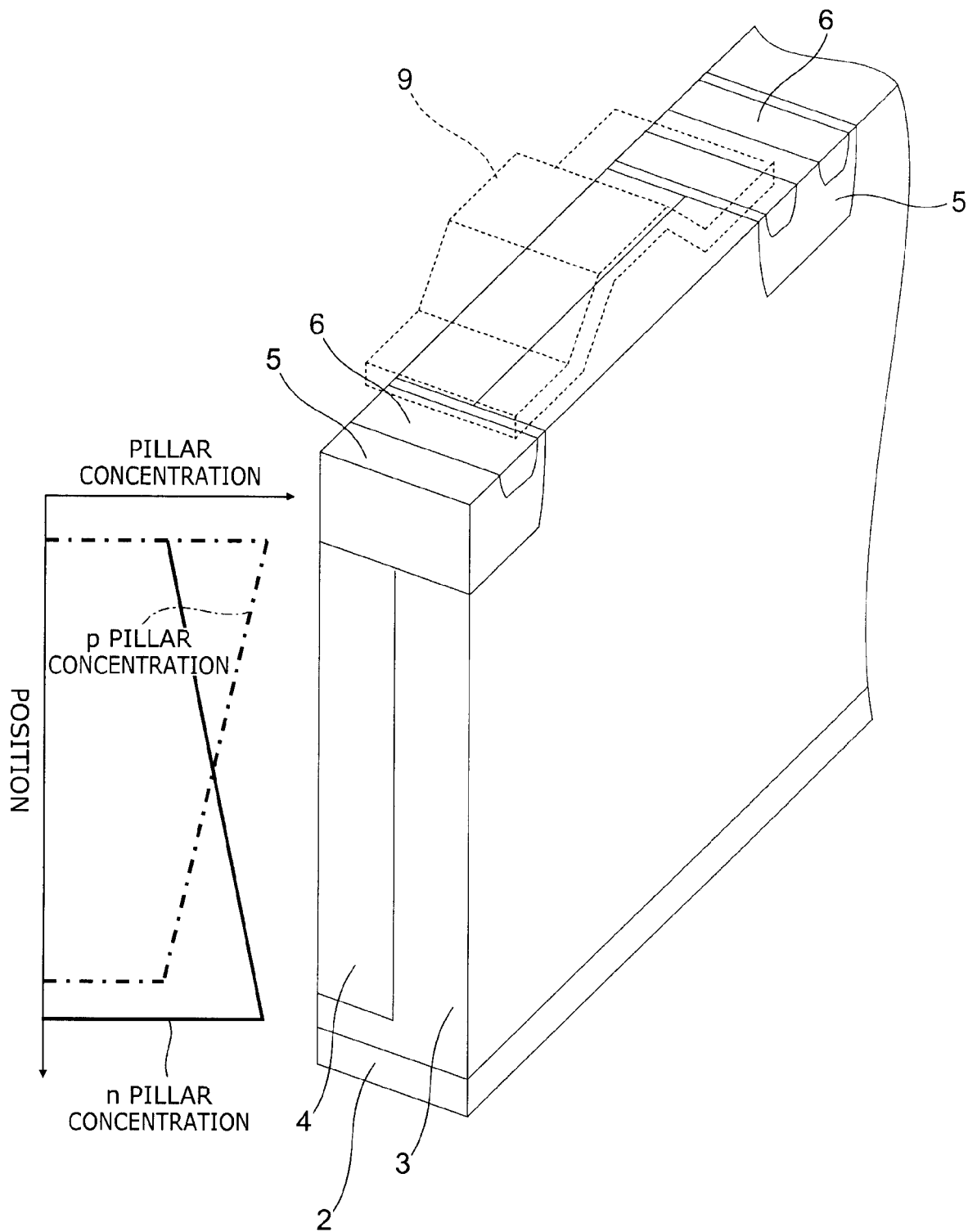
FIG. 6 is a perspective cross-sectional view schematically illustrating a power MOSFET according to a modified example of the third embodiment and a graphic view illustrating a profile of an impurity concentration of a SJ structure, in which the vertical axis is position in the longitudinal direction in the SJ structure and the horizontal axis is pillar concentration.

FIG. 6 is a perspective cross-sectional view schematically illustrating a power MOSFET according to a modified example of the third embodiment and a graphic view illustrating a profile of an impurity concentration of a SJ structure, in which the vertical axis is position in the longitudinal direction in the SJ structure and the horizontal axis is pillar concentration.

As shown in FIG. 6, in the power MOSFET according to this embodiment, the impurity concentration profile of the n-pillar layer 3 and the impurity concentration profile of the p-pillar layer 4 have reverse gradients to each other. That is, along the direction from the source electrode 7 toward the drain electrode 1, the impurity concentration of the p-pillar layer 4 continuously decreases and the impurity concentration of the n-pillar layer 3 continuously increases. Thereby, in a part of the side of the source electrode 7 in the SJ structure, the impurity concentration in the p-pillar layer 4 is higher than the impurity concentration of the n-pillar layer 3. In a part of side of the drain electrode 1 therein, the impurity concentration in the p-pillar layer 4 is lower than the impurity concentration of the n-pillar layer 3. It is also possible that in the longitudinal direction, the impurity concentration is set to be constant and the widths of the pillar layers are varied.

The electric fields in the upper and lower ends of the SJ structure is determined by difference between the sheet impurity concentrations (each=impurity concentration $(cm^{-3})\times$ width of pillar layer (cm)) of the n-pillar layer 3 and the p-pillar layer 4. Therefore, if the impurity concentration or the width of any one or each of the pillar layers is varied, the electric-field distribution in the longitudinal direction of the SJ structure can be controlled. Therefore, also according to this modified example, the same working effects as the third embodiment can be obtained.

Fourth Embodiment

Figure 7:
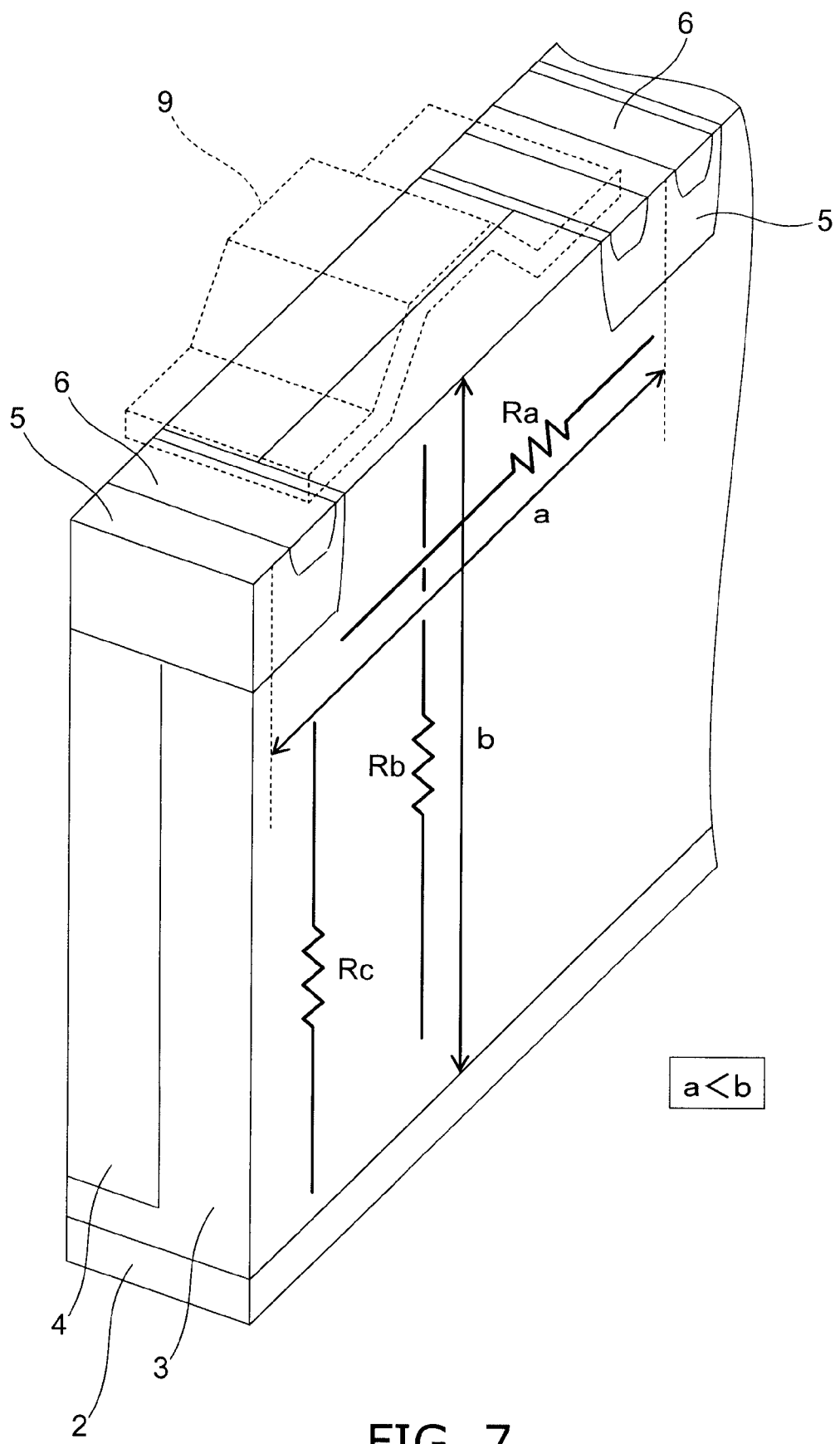
FIG. 7 is a perspective cross-sectional view schematically illustrating a power MOSFET according to a fourth embodiment of this invention.

FIG. 7 is a perspective cross-sectional view schematically illustrating a power MOSFET according to a fourth embodiment of this invention.

As shown in FIG. 7, in the power MOSFET according to this embodiment, in the central portion of the gate electrode 9, about half of the breakdown voltage is held by the SJ structure and the residual about half thereof is held by the central portion 8aa of the gate insulating film (see, FIG. 1). And, when an array period of the p-base layers 5 is a and a thickness of the SJ structure is b, a<b. The structure except for the above-described part is the same as the above-described second embodiment (FIG. 4).

Hereinafter, the reason why the array period a of the p-base layers 5 is set to be smaller than the thickness b of the SJ structure will be explained.

As shown in FIG. 7, in the n-pillar layer 3, resistance of the current passage extending to the lateral direction between the contiguous p-base layers 5 is set to be Ra, and resistance of the current passage extending to the longitudinal direction from the p-base layer 5 to the $n^+$ drain layer 2 in the central portion between the p-base layers 5 is set to be Rb, and resistance of the current passage extending to the longitudinal direction from the p-base layer 5 to the $n^+$ drain layer 2 immediately under the p-base layer 5 is set to be Rc.

In this case, resistance of the passage of the electronic current flowing from the p-base layer 5 to the immediately lower direction (direct passage) out of the passages of the electric currents flowing from the p-base layer 5 to the $n^+$ drain layer 2 through the inside of the n-pillar layer 3 becomes Rc. On the other hand, resistance of the passage of the electronic current flowing from the p-base layer 5 to the immediately lower direction (bypass passage) by bypassing the central portion between the p-base layers 5 becomes a sum of spreading resistance (Ra/2) and resistance in the longitudinal direction in the central portion between the p-base layers 5 (Rb) and therefore becomes (Ra/2+Rb).

If the resistance of the bypass passage is not smaller than the resistance of the direct passage, the electronic current does not effectively expand, and the effect of reducing the ON resistance becomes small. Accordingly, it is preferable that the following mathematical formula 1 is satisfied.

$$Ra/2+Rb<Rc \tag{1}$$

Moreover, in the SJ structure, the hold voltage in the central portion between the p-base layers 5 is half of the hold voltage in the immediately lower region of the p-base layer 5, and therefore, the following mathematic formula 2 is established.

$$Rb=Rc/2 \tag{2}$$

The following mathematical formula 3 is established by the above mathematical formulas 1 and 2, and the following mathematical formula 4 is established by finalizing the mathematical formula 3.

$$Ra/2+Rc/2<Rc \tag{3}$$

$$Ra<Rc \tag{4}$$

And, it is thought that in the n-pillar layer 3, resistivity of the longitudinal direction and resistivity of the lateral direction are equal. Therefore, magnitude of resistance is proportional to length of passage. Accordingly, the following mathematical formula 5 is established.

$$a<b \tag{5}$$

As described above, according to this embodiment, by prescribing the relation between the array period a of the p-base layers 5 and the thickness b of the SJ structure, the current passage is expanded to the immediately lower region of the gate electrode 9, and thereby, the ON resistance can be more reduced. The working effects except for the above-described effect are the same as the above-described second embodiment.

Fifth Embodiment

Figure 8:
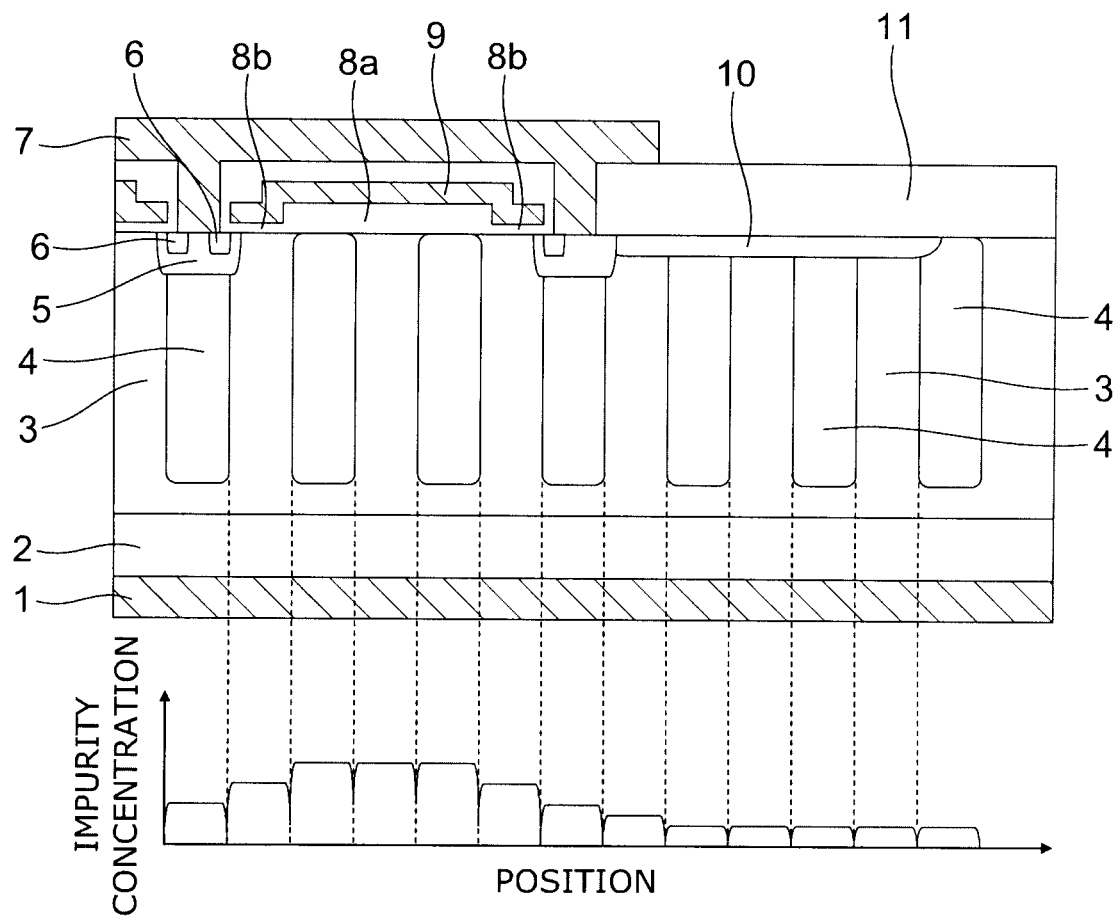
FIG. 8 is a cross-sectional view schematically illustrating a power MOSFET according to a fifth embodiment of this invention and a graphic view illustrating a profile of an impurity concentration of a SJ structure, in which the horizontal axis is position of the lateral direction in the SJ structure and the vertical axis is pillar concentration.

FIG. 8 is a cross-sectional view schematically illustrating a power MOSFET according to a fifth embodiment of this invention and a graphic view illustrating a profile of an impurity concentration of a SJ structure, in which the horizontal axis is position of the lateral direction in the SJ structure and the vertical axis is pillar concentration.

Figure 9:
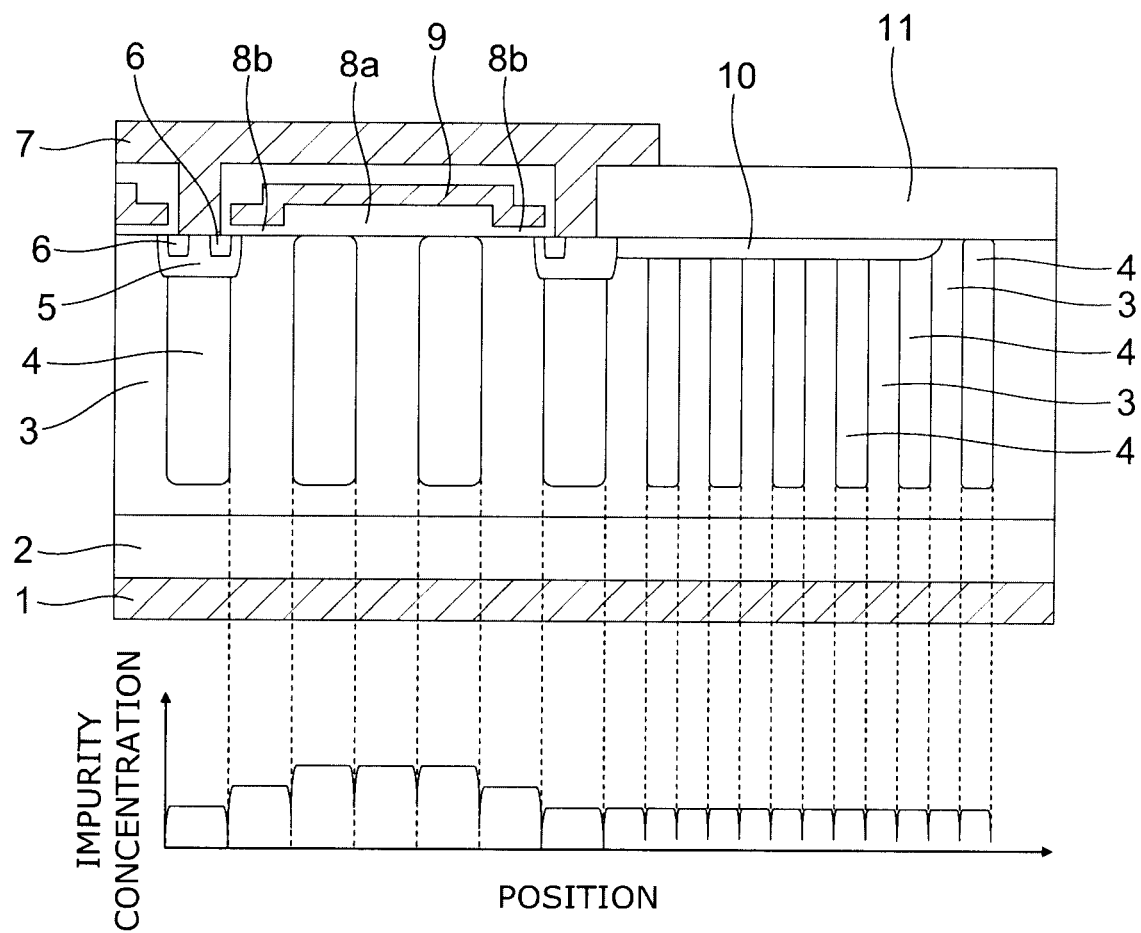
FIG. 9 is a cross-sectional view schematically illustrating a power MOSFET according to a modified example of the fifth embodiment and a graphic view illustrating a profile of an impurity concentration of a SJ structure, in which the horizontal axis is position of the lateral direction in the SJ structure and the vertical axis is pillar concentration.
Figure 10:
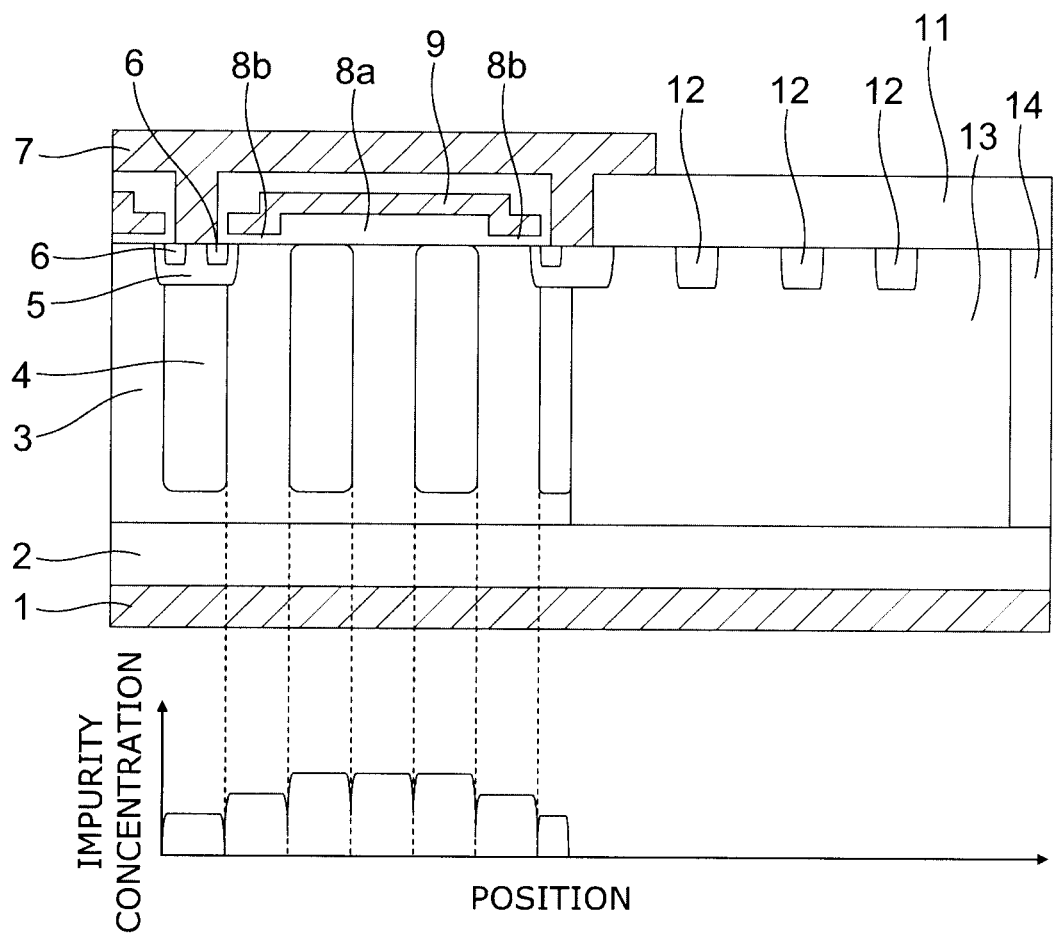
FIG. 10 is a cross-sectional view schematically illustrating a power MOSFET according to a sixth embodiment of this invention and a graphic view illustrating a profile of an impurity concentration of a SJ structure, in which the horizontal axis is position of the lateral direction in the SJ structure and the vertical axis is pillar concentration.
Figure 11:
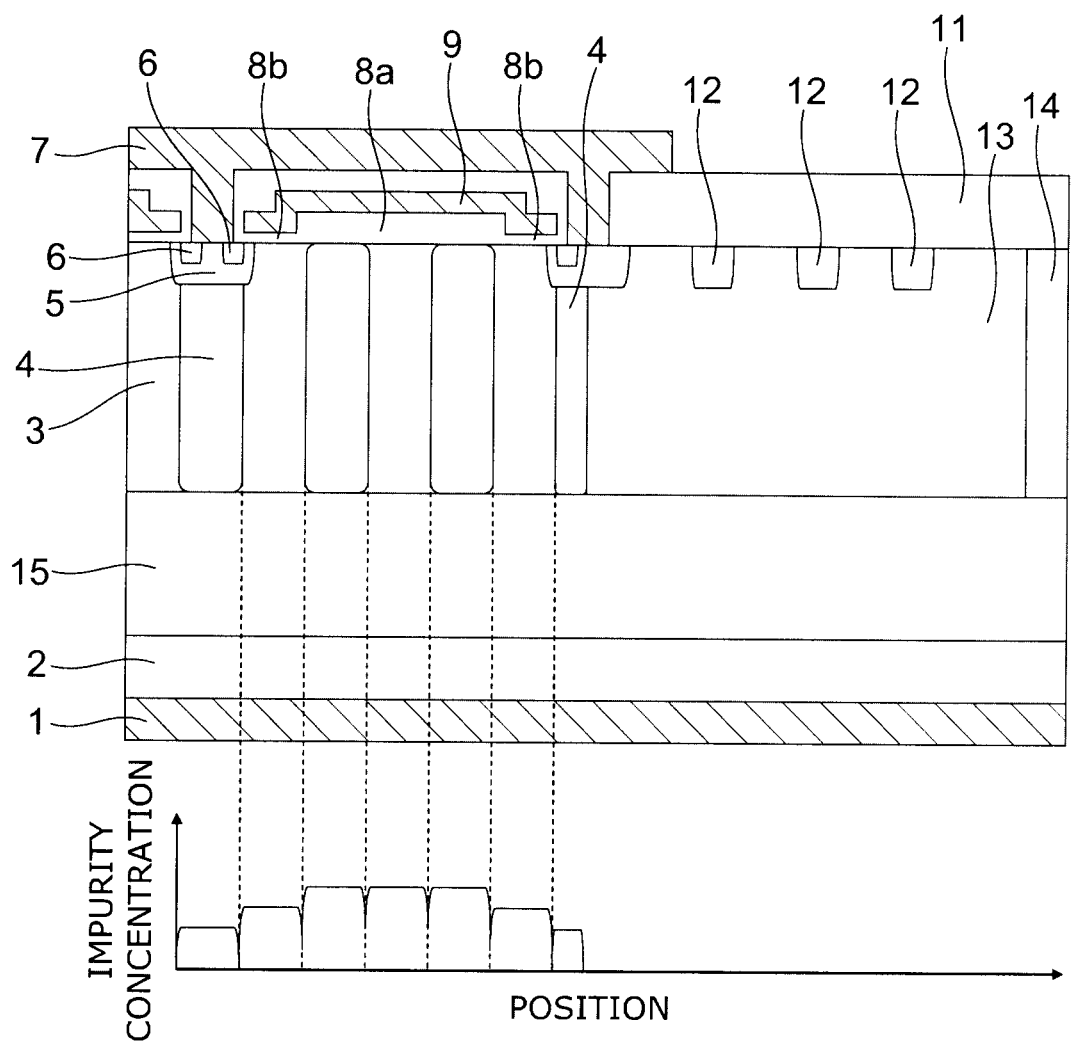
FIG. 11 is a cross-sectional view schematically illustrating a power MOSFET according to a seventh embodiment of this invention and a graphic view illustrating a profile of an impurity concentration of a SJ structure, in which the horizontal axis is position of the lateral direction in the SJ structure and the vertical axis is pillar concentration.

As shown in FIG. 8, a cross-sectional structure of the power MOSFET including a device edge termination portion is shown. FIGS. 9 to 11 to be described later are shown similarly. In the above-described FIGS. 1 to 7, only the cell portion of each of the devices, namely, the portion composing the central portion of each of the devices and mainly flowing current is shown.

As shown in FIG. 8, in the power MOSFET according to this embodiment, the SJ structure is also formed in the edge termination portion of the device in which the gate electrode 9 is not formed. The pillar concentration in the SJ structure formed in the edge termination portion is lower than the pillar concentration of the SJ structure formed in the cell portion. Moreover, on the upper portion of the SJ structure formed in the edge termination portion, a RESURF (reduced surface field) layer 10 is formed, and thereon, a field insulating film 11 is provided. The field insulating film 11 is thicker than the gate insulating film 8. The structure except for the above-described part in this embodiment is the same as the above-described first embodiment.

In this embodiment, the SJ structure is also formed in the edge termination portion of the device, and the pillar concentration thereof is lower than that of the SJ structure formed in the cell portion. Thereby, the SJ structure in the edge termination portion is fully depleted at lower voltage than that of the SJ structure. Moreover, because the RESURF layer 10 is provided, the depletion layer easily extends in the lateral direction. Furthermore, in the edge termination portion of the device, the thick field insulating film 11 is provided and some of the breakdown voltage is held. By these things, according to this embodiment, the breakdown voltage in the edge termination portion can be higher than the breakdown voltage in the cell portion. As a result, avalanche tolerance in the entirety of the device is improved to be capable of enhancing reliability. The working effects except for the above-described effect in this embodiment are the same as the above-described first embodiment.

Modified Example of Fifth Embodiment

FIG. 9 is a cross-sectional view schematically illustrating a power MOSFET according to a modified example of the fifth embodiment and a graphic view illustrating a profile of an impurity concentration of a SJ structure, in which the horizontal axis is position of the lateral direction in the SJ structure and the vertical axis is pillar concentration.

As shown in FIG. 9, in this modified example, an array period of the n-pillar layers 3 and the p-pillar layers 4 in the edge termination portion is smaller than an array period in the cell portion. Thereby, the SJ structure in the edge termination portion is fully depleted at a lower voltage than that of the SJ structure and the breakdown voltage in the edge termination portion is relatively higher, too. The pillar concentrations of the edge termination portion and the cell portion may be set to be the same, or the concentration of the edge termination portion may be set to be lower than that of the cell portion. The structure and the working effects except for the above-described ones in this embodiment are the same as the above-described fifth embodiment.

In the fifth embodiment and the modified example thereof, the examples in which the RESURF 10 is provided in the edge termination portion of the device are shown. However, the terminal structure is not limited thereto. For example, a field plate electrode connected to the source electrode 7 or to the gate electrode 9 may be provided above the field insulating film 11.

Sixth Embodiment

FIG. 10 is a cross-sectional view schematically illustrating a power MOSFET according to a sixth embodiment of this invention and a graphic view illustrating a profile of an impurity concentration of a SJ structure, in which the horizontal axis is position of the lateral direction in the SJ structure and the vertical axis is pillar concentration.

As shown in FIG. 10, in the power MOSFET according to this embodiment, in the edge termination portion of the device, the SJ structure is not formed and a high-resistance n$^-$ layer 13 is formed as a sixth semiconductor layer of the first conductivity type. The impurity concentration of the high-resistance n$^-$ layer 13 is lower than the impurity concentration of the n$^+$ drain layer 2. Moreover, one or a plurality of guard-ring layer(s) 12 is/are formed as a seventh semiconductor layer of the second conductivity type in the upper surface of the high-resistance n$^-$ layer 13. Furthermore, in the side surface of the outermost periphery of the power MOSFET, a field stop n layer 14 is formed. The field stop n layer 14 can be formed at the same time as the formation of the n-pillar layers 3.

According to this embodiment, in the edge termination portion, not the SJ structure but the high-resistance n$^-$ layer 13 is provided, and thereby, the breakdown voltage in the edge termination portion becomes difficult to be affected by variation of the impurity concentration of the SJ structure. Moreover, by providing the guard-layer 12, concentration of electric field in the end portion of the p-base layers 5 can be suppressed. Furthermore, by providing the field stop n layer 14 in the side surface of the outermost periphery, a depletion layer extending in the edge termination portion can be prevented from reaching the dicing line. Thereby, the breakdown voltage in the edge termination portion can be stabilized.

In this embodiment, it is preferable that the sheet impurity concentration of the pillar layer in the outermost periphery of the SJ structure is half of the sheet impurity concentration of the inner pillar layers. This is because the outside of the SJ structure is the high-resistance n$^-$ layer 13 and therefore if the depletion layer extends from the interface between the SJ structure and the high-resistance n$^-$ layer 13 to the high-resistance n$^-$ layer 13, the layer does not extend in the SJ structure. Accordingly, the outermost portion of the SJ structure is depleted only from the inside of the SJ structure, and therefore, if the sheet impurity concentration of the pillar layer in the outermost periphery is not half, a region that is not depleted is left and the breakdown voltage comes to lower.

The structure and the working effects except for the above-described ones in this embodiment are the same as the above-described second embodiment. In this embodiment, the example whose edge termination portion has a guard-ring structure has been explained. However, the terminal structure is not limited thereto, and another terminal structure such as a RESURF structure or a field plate structure may be used.

Seventh Embodiment

FIG. 11 is a cross-sectional view schematically illustrating a power MOSFET according to a seventh embodiment of this invention and a graphic view illustrating a profile of an impurity concentration of a SJ structure, in which the horizontal axis is position of the lateral direction in the SJ structure and the vertical axis is pillar concentration.

As shown in FIG. 11, in the power MOSFET according to this embodiment, an n$^-$ layer 15 is formed as a eighth semiconductor layer of the first conductivity type between the SJ structure and the n$^+$ drain layer 2. The impurity concentration of the n$^-$ layer 15 is lower than the impurity concentration of the n$^+$ drain layer 2. Thereby, the breakdown voltage of the device can be increased by the amount of the hold voltage by n$^-$ layer 15. The structure and the working effects except for the above-described ones in this embodiment are the same as the above-described sixth embodiment.

As described above, this invention has been explained with reference to the first to seventh embodiments and the modified examples thereof. However, this invention is not limited thereto. For example, the above-described respective embodiments or the modified examples thereof to which addition, deletion, or design change of a component is subjected appropriately by a skilled person are included in the scope of this invention as long as having the essentials of this invention.

For example, in each of the above-described embodiments and the modified examples, the description is performed by setting the first conductivity type to be n type and the second conductivity type to be p type. However, this invention can also be carried out so that the first conductivity type is set to be p type and that the second conductivity type is n type.

Moreover, the method for forming the super-junction structure is not particularly limited, and the formation is possible by various methods such as, a method of repeating plural times of ion implantation and epitaxial growth, a method of performing burying growth of the pillar layers after forming a trench growth, a method of subjecting ion implantation to a side wall after forming a trench growth, and a method of performing plural times of ion implantation with changing the acceleration voltage.

Furthermore, in each of the above-described embodiments and the modified examples, the MOSFET in which silicon (Si) is used as the semiconductor has been explained. However, as the semiconductor, a compound semiconductor such as silicon carbide (SiC) or gallium nitride (GaN) or a wide band gap semiconductor such as diamond can also be used.

Moreover, in each of the above-described embodiments and the modified examples, the examples in which the power semiconductor device is MOSFET having a super-junction structure. However, this invention is not limited thereto, but the power semiconductor device may be a device such as, a mixed device of MOSFET and SBD (Schottky Barrier Diode), or an IGBT (Insulated Gate Bipolar Transistor).

The invention claimed is:

1. A power semiconductor device, comprising:
a first semiconductor layer of a first conductivity type;
a second semiconductor layer of the first conductivity type formed on the first semiconductor layer;
a plurality of third semiconductor layers of a second conductivity type formed in the second semiconductor layer with predetermined spaces therebetween;
a plurality of fourth semiconductor layers of the second conductivity type provided on some of immediately upper regions of the third semiconductor layers and connected to the some of third semiconductor layers;
a fifth semiconductor layer of the first conductivity type selectively formed on an upper surface of each of the fourth semiconductor layers;
a control electrode provided between immediately upper regions of contiguous of the fourth semiconductor layers;
a gate insulating film provided between an upper surface of the second semiconductor layer and the control electrode, the gate insulating film including first parts and a second part, the first parts being disposed in the immediately upper regions of contiguous of the fourth semiconductor layers, the second part being disposed in an immediate upper region of a central portion of the gate insulating film between the fourth semiconductor layers, the second part being located between the first parts, a second thickness of the second part being thicker than a first thickness of each of the first parts;
a first main electrode provided on a lower surface of the first semiconductor layer and electrically connected to the first semiconductor layer; and
a second main electrode provided on the fourth semiconductor layers and the fifth semiconductor layer and connected to the fourth semiconductor layers and the fifth semiconductor layer, and
a first sheet impurity concentration of the second semiconductor layer located in an immediately lower region of the second part of the gate insulating film being higher than a second sheet impurity concentration of one of the third semiconductor layers disposed in an immediately lower region of one of the first parts of the gate insulating film,
a third sheet impurity concentration of a second of the third semiconductor layers disposed in a second immediately lower region of the second part of the gate insulating film being higher than the second sheet impurity concentration.

2. The power semiconductor device according to claim 1, wherein
widths of the second semiconductor layer and the third semiconductor layers are constant, and
the impurity concentrations of the second semiconductor layer and the third semiconductor layers that are located in the central portion are higher than the impurity concentration of the third semiconductor layers disposed in the immediately lower region of the fourth semiconductor layers.

3. The power semiconductor device according to claim 1, wherein
the impurity concentrations of the second semiconductor layer and the third semiconductor layers are constant, and
total widths of the second semiconductor layer and the third semiconductor layers that are located in the central portion are larger than the widths of the third semiconductor layers disposed in an immediately lower region of the fourth semiconductor layers.

4. The power semiconductor device according to claim 1, wherein the control electrode extends from a part of one of the immediately upper regions of the fourth semiconductor layers, through an immediately upper region of the second semiconductor layer and the third semiconductor layers arranged between the contiguous fourth semiconductor layers, to a part of another of the immediately upper regions of the fourth semiconductor layers.

5. The power semiconductor device according to claim 1, wherein
both end portions of the control electrode in a longitudinal direction of the control electrode extend in a direction inclining to the upper surface of the first semiconductor layer,
the sheet impurity concentration of the second semiconductor layer has an intermediate value of sheet impurity concentrations of the third semiconductor layer arranged at both sides of the second semiconductor layer along the longitudinal direction, and
the sheet impurity concentration of the third semiconductor layers has an intermediate value of sheet impurity concentrations of the second semiconductor layer arranged at both sides of the third semiconductor layers along the longitudinal direction.

6. The power semiconductor device according to claim 1, wherein viewed from a direction vertical to the upper surface of the first semiconductor layer, the second semiconductor layer is arranged in a matrix form, the third semiconductor layers are formed in a lattice shape and the third semiconductor layers are buried in the second semiconductor layer.

7. The power semiconductor device according to claim 1, wherein the second semiconductor layer and the third semiconductor layers are formed in a stripe form.

8. The power semiconductor device according to claim 7, wherein the fourth semiconductor layers are formed in a stripe form, and an extension direction of the fourth semiconductor layers intersects with an extension direction of the second semiconductor layer and the third semiconductor layers.

9. The power semiconductor device according to claim 8, wherein an array period of the fourth semiconductor layers is smaller than a thickness of the second semiconductor layer.

10. The power semiconductor device according to claim 1, wherein the sheet impurity concentrations of the second semiconductor layer and the third semiconductor layers increase continuously from an immediately lower region of the fourth semiconductor layers to the central portion.

11. The power semiconductor device according to claim 1, wherein the sheet impurity concentration of the second semiconductor layer is lower than the sheet impurity concentration of the third semiconductor layers in a part of the second main electrode side and is higher than the sheet impurity concentration of the third semiconductor layers in a part of the first main electrode side.

12. The power semiconductor device according to claim 1, wherein the second semiconductor layer and the third semiconductor layers are also formed in a device edge termination portion in which the control electrode is not formed.

13. The power semiconductor device according to claim 12, wherein impurity concentrations of the second semiconductor layer and the third semiconductor layers formed in the device edge termination portion are lower than impurity concentrations of the second semiconductor layer and the third semiconductor layers formed in a cell portion.

14. The power semiconductor device according to claim 12, wherein an array period of the second semiconductor layer and the third semiconductor layers formed in the device edge termination portion is smaller than the array period of the second semiconductor layer and the third semiconductor layers formed in a cell portion.

15. The power semiconductor device according to claim 12, further comprising a RESURF layer formed on an upper portion of the second semiconductor layer and the third semiconductor layers in the device edge termination portion.

16. The power semiconductor device according to claim 12, further comprising a field insulating film formed on an upper portion of the second semiconductor layer and the third semiconductor layers in the device edge termination portion.

17. The power semiconductor device according to claim 1, further comprising a sixth semiconductor layer of the first conductivity type provided on the first semiconductor layer in a device edge termination portion in which the control electrode is not formed, the sixth semiconductor layer having lower impurity concentration than the first semiconductor layer, and the second semiconductor layer and the third semiconductor layers being not provided in the device edge termination portion.

18. The power semiconductor device according to claim 17, further comprising a seventh semiconductor layer of the second conductivity type formed in an upper surface of the sixth semiconductor layer.

19. The power semiconductor device according to claim 17, wherein the sheet impurity concentrations of the second semiconductor layer and the third semiconductor layers that are in contact with the sixth semiconductor layer are half of the sheet impurity concentrations of the second semiconductor layer and the third semiconductor layers in the center portion.

20. The power semiconductor device according to claim 1, further comprising an eighth semiconductor layer of the first conductivity type provided between the first semiconductor layer and the second semiconductor layer, and between the first semiconductor layer and the third semiconductor layers.

* * * * *